(12) United States Patent
Terzioglu et al.

(10) Patent No.: US 6,771,551 B1
(45) Date of Patent: Aug. 3, 2004

(54) SENSE AMPLIFIER WITH ADAPTIVE REFERENCE GENERATION

(75) Inventors: Esin Terzioglu, Aliso Viejo, CA (US); Morteza Cyrus Afghahi, Mission Viejo, CA (US); Gil I. Winograd, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/423,346

(22) Filed: Apr. 25, 2003

Related U.S. Application Data

(60) Provisional application No. 60/445,305, filed on Feb. 4, 2003.

(51) Int. Cl.[7] ................................................ G11C 7/00
(52) U.S. Cl. ...................... 365/205; 365/203; 365/208; 365/210
(58) Field of Search ................................ 365/203, 205, 365/207, 208, 210

(56) References Cited

U.S. PATENT DOCUMENTS 5,963,484 A * 10/1999 Jung ...................... 365/189.09
6,411,557 B2 * 6/2002 Terzioglu et al. ........... 365/200
6,566,913 B2 * 5/2003 Dai ............................. 327/52

* cited by examiner

Primary Examiner—Son Mai
(74) Attorney, Agent, or Firm—McAndrews, Held & Malloy, Ltd.

(57) ABSTRACT

A digital memory system (30) includes a memory cell (52), a bit line (50), a transfer gate (60) a reference voltage generator (40), a sense amplifier (70) and a control circuit (80). The control circuit precharges the bit line to a bit line precharge voltage, which is sampled and stored. A corresponding reference voltage is generated after the bit line is isolated. The bit line and reference voltage are coupled to the sense amplifier so that a voltage is received based on charge stored in the memory cell. The sense amplifier then is isolated from the bit line and reference voltage and the sense amplifier is energized so that an output voltage is derived from the charge and reference voltage.

12 Claims, 2 Drawing Sheets

SENSE AMPLIFIER WITH ADAPTIVE REFERENCE GENERATION

CROSS-REFERENCE TO RELATED APPLICATIONS

The applicants claim the benefit of the provisional application No. 60/445,305, entitled "Sense Amplifier With Adaptive Reference Generation," filed Feb. 4, 2003.

BACKGROUND OF THE INVENTION

This invention relates to sense amplifiers for memory cells and more particularly relates reference voltage generators for such sense amplifiers.

When a memory cell is not differential (such as in a flash memory or other dense memory), a sense amplifier for the cell has to determine the value of a bit stored in the cell by monitoring a single bit line coming out of the cell. Such a sense amplifier needs a reference to trigger the digital value in the cell. This threshold can be generated by well-known techniques, such as using "half-cells" or a fixed or adaptive reference voltage. In some applications, it is desirable to have a reference voltage that is a fixed percentage of a supply voltage to assure some tracking.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

One apparatus embodiment of the invention is useful in a digital memory system including a memory cell arranged to store charge. In such an environment, an adaptive reference voltage can be generated by providing apparatus comprising a bit line coupled to the cell and arranged to conduct a current based on the charge stored in the cell, a transfer gate, a reference voltage generator arranged to generate a reference voltage, a sense amplifier and a control circuit. The control circuit is operative during a first mode of operation to precharge the bit line to generate a bit line precharge voltage and to cause the transfer gate to sample and store the precharge voltage, operative during a second mode of operation to cause the transfer gate to isolate the bit line from the reference voltage generator, to cause the reference voltage generator to generate the reference voltage in response to the sampled and stored precharge voltage and to couple the bit line and the reference voltage to the sense amplifier, and operative during a third mode of operation to isolate the sense amplifier from the bit line and the reference voltage and to energize the sense amplifier to generate an output voltage derived from charge stored in the memory cell and the reference voltage.

One method embodiment of the invention is useful in a digital memory system including a memory cell arranged to store charge and a bit line. In such an environment, an adaptive reference voltage can be generated by a method comprising precharging the bit line to generate a bit line precharge voltage and sampling and storing the bit line precharge voltage. The bit line is isolated from the sampled and stored bit line precharge voltage. A reference voltage is generated in response to the sampled and stored precharge voltage. The bit line and the reference voltage are coupled to the sense amplifier so that the sense amplifier receives a voltage based on charge stored in the memory cell. The sense amplifier is isolated from the bit line and the reference voltage and the sense amplifier is energized to generate an output voltage derived from the charge stored in the memory cell and the reference voltage.

By using the foregoing techniques, a reference voltage for a sense amplifier can be generated with noise suppression characteristics previously unattainable.

These and other advantages and novel features of the present invention, as well as details of an illustrated embodiment thereof, will be more fully understood from the following description and drawings.

BRIEF DESCRIPTION OF THE DRAWING

FIG. 1 is a graph showing the arrangement of FIGS. 1A and 1B.

DETAILED DESCRIPTION OF THE INVENTION

Figure 1A:
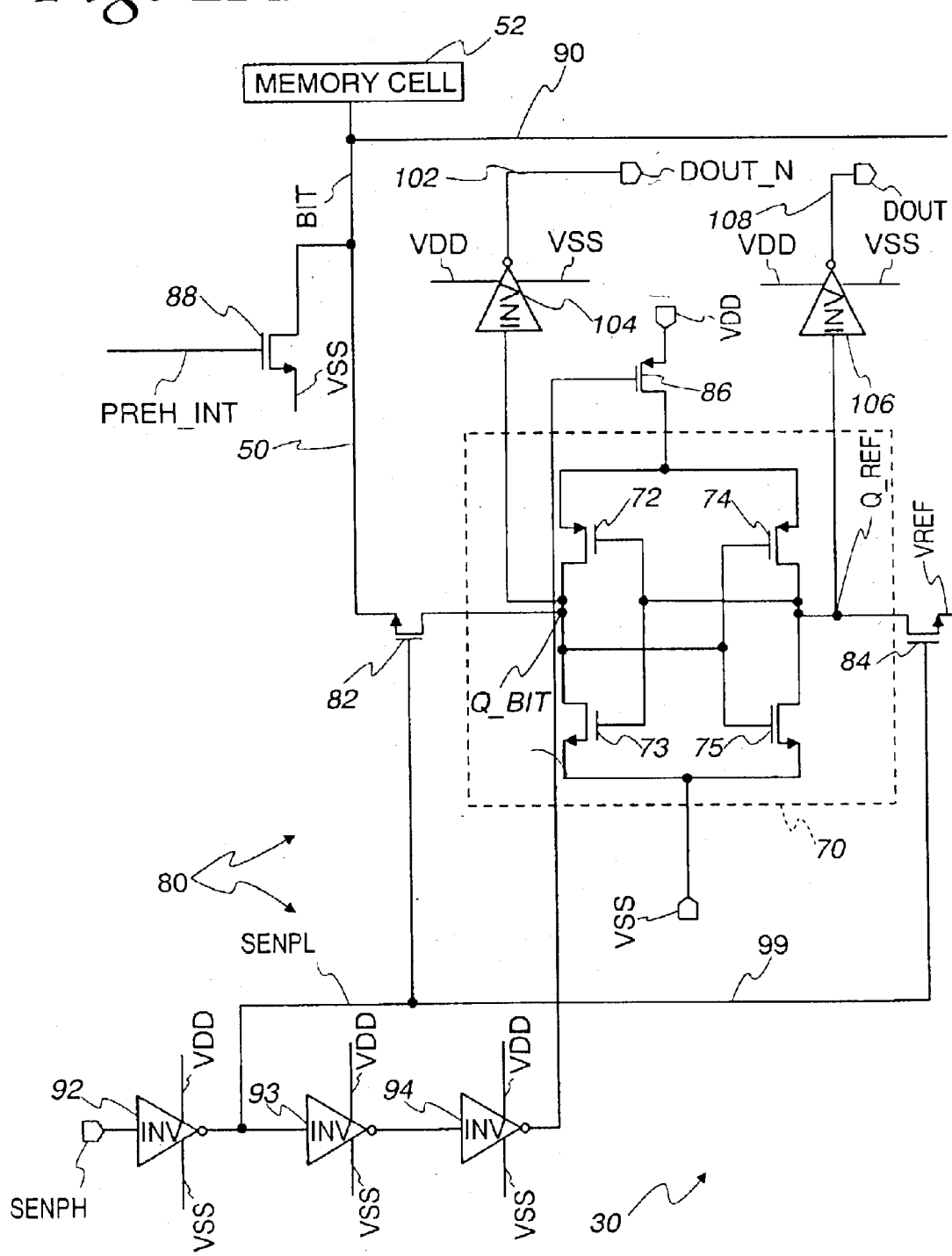
FIGS. 1A and 1B are schematic diagrams of one embodiment of the invention.
Figure 1B:
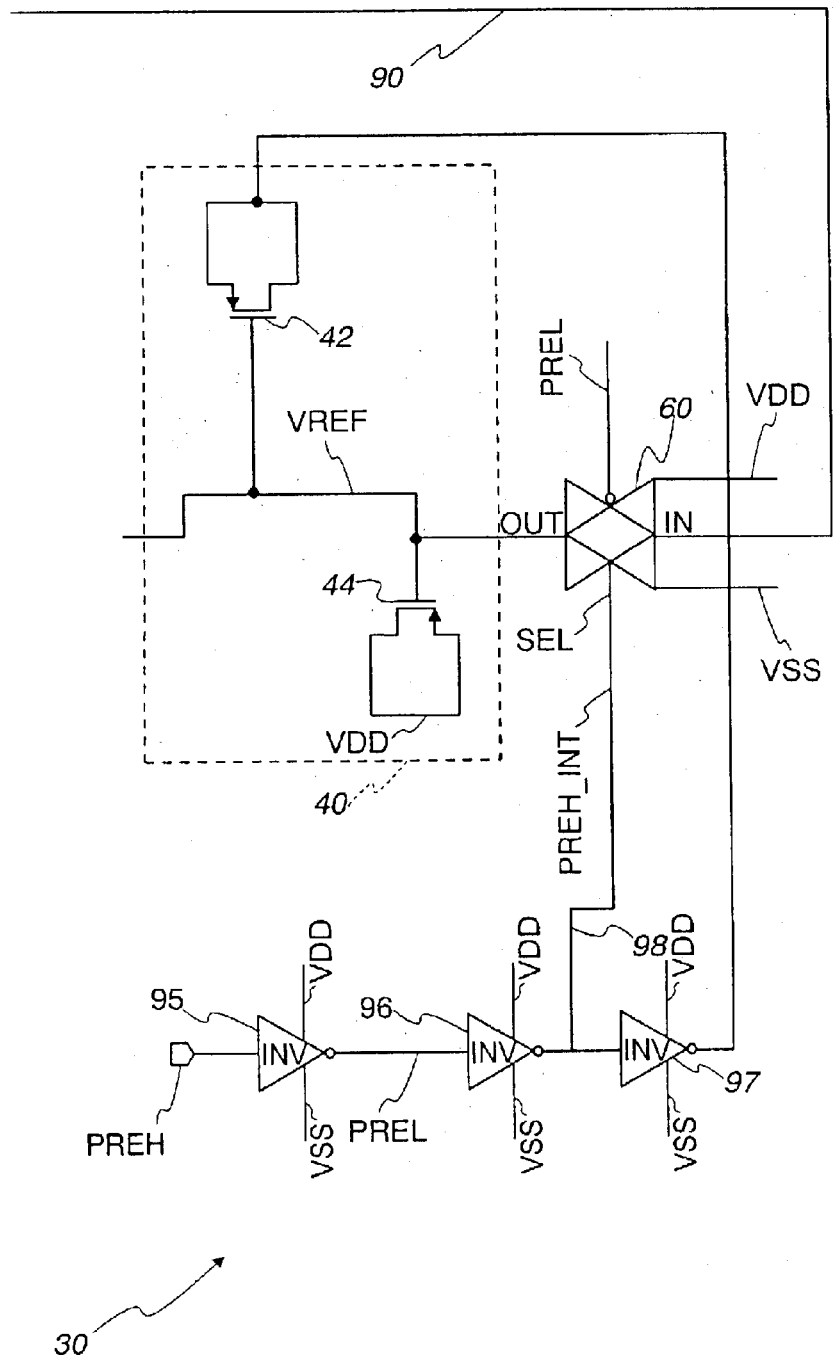
Figure 1B:
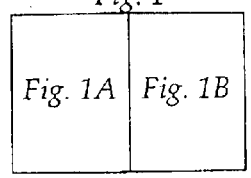

FIG. 1 illustrates a digital memory system 30 including a single-ended sense amplifier that has a built-in reference voltage generator 40 with noise suppression capability. A single-ended bit line 50 is sampled and held by a transfer gate 60 at the same time the bit line is floated or precharged (in anticipation of the integration time when the memory cell 52 is connected to the floating bit line). An exemplary memory cell 52 is described as cell 10 in U.S. Application Ser. No. 10/151,981, entitled "Non-Volatile Memory Cell Techniques," filed May 21, 2002 in the names of Terzioglu, Afghahi and Winograd, which is incorporated by reference in its entirety into this application.

If there is noise on the bit line, the sampled reference voltage includes this noise, and it thus becomes common mode (i.e., ignored by differential sense amplifier 70). The sampled voltage stored in transfer gate 60 is then increased for a pull-up sense amplifier (or decreased for a pull-down sense amplifier) by a fixed fraction of the supply voltage by a capacitive divider circuit, such as transistor capacitors 42 and 44, to form a reference voltage. This reference voltage is used by differential pull-up type sense amplifier 70.

Still referring to FIG. 1, transistors 72–75 form a cross-coupled differential sense amplifier 70.

A control circuit 80 includes access transistors 82 and 84 that couple bit line 50 and voltage generator 40 to the internal nodes of sense amplifier 70. When the sense amplifier is energized, transistors 82 and 84 turn off, isolating the internal nodes of amplifier 70. A transistor 86 determines when amplifier 70 is energized by coupling to a supply voltage VDD. A transistor 88 precharges bit line 50 to 0 volts. Bit line 50 is coupled to the q_bit node of sense amplifier 70 by transistor 82. Bit line 50 also is coupled to transfer gate 60 over a path 90.

Control circuit 80 also includes inverters 92–97. At the moment the precharge transistor 88 is turned off, (when the preH_int signal becomes zero), transfer gate 60 also is turned off, thereby isolating bit line 50 from voltage generator 40. After one gate delay (through inverter 97) the source/drain nodes of transistor 42 are pulled high, coupling the Vref node up by a fixed fraction of the supply voltage VDD in order to generate the reference voltage for amplifier 70 on node Vref. The fraction is determined by the relative capacitance of transistor 42 and the node capacitance at node Vref, which includes the capacitance of transistor 44. The node Vref capacitance can be adjusted by changing the size of transistor 44, which is connected to a fixed voltage VDD.

After reference voltage generator 40 has generated the reference voltage on node Vref, current is caused to flow from bit line 50 to node q_bit in amplifier 70 in response to charge stored in memory cell 52. The time during which current is flowing is known as the integration period. At the end of the integration period, the senpH signal is pulled high. As a result, transistors 82 and 84 are turned off after one inverter delay resulting from inverter 92. After two more inverter delays caused by inverters 93–94, sense amplifier 70 is energized when transistor 86 is turned on. After being energized, sense amplifier 70 compares the values at q_ref and q_bit to determine the amount of charge stored in memory cell 52, which determines the logical value stored in cell 52. The value of q_bit is adjusted by the interaction of cell 52 with bit line 50.

The operation of the circuitry shown in FIG. 1 may be summarized as follows:

Bit line 50 is precharged when control circuit 80 turns on transistor 88 to generate a bit line precharge voltage on bit line 50. The bit line precharge voltage is sampled and stored by gate 60. Such gates are well known in the electronics arts.

After the precharge voltage is sampled and stored, bit line 50 is isolated from the sampled and stored bit line precharge voltage by gate 60 in response to the preH signal on path 98. Reference voltage generator 40 then generates a reference voltage on node Vref in response to the sampled and stored precharge voltage stored by gate 60. Bit line 50 and the reference voltage on node Vref are coupled to amplifier 70 in response to a first senpH signal on a path 99 by turning on transistors 82 and 84, respectively, and by turning off transistor 86. After memory cell 52 is addressed by an addressing circuit (not shown), sense amplifier 70 receives a voltage on bit line 50 based on charge stored in memory cell 52 through transistor 82.

After the integration period, sense amplifier 70 is isolated from bit line 50 and the reference voltage on node Vref when a second senpH signal turns off transistors 82 and 84. After a delay caused by inverter 94, sense amplifier 70 is energized by turning on transistor 86 that couples amplifier 70 to voltage source VDD. As a result, amplifier 70 generates an output voltage based on the voltage on line 50 that is derived from the charge stored in the memory cell and the reference voltage on a path 102. The output voltage is transmitted through an inverter 104. A reference voltage output is transmitted through an inverter 106 to an output path 108 for the purpose of symmetry loading on nodes q_bit and q_ref.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. In a digital memory system including a memory cell arranged to store charge, apparatus providing an adaptive reference voltage comprising:
    a bit line coupled to the cell and arranged to conduct a current based on the charge stored in the cell;
    a transfer gate;
    a reference voltage generator arranged to generate a reference voltage;
    a sense amplifier; and
    a control circuit operative during a first mode of operation to precharge the bit line to generate a bit line precharge voltage and to cause the transfer gate to sample and store the precharge voltage, operative during a second mode of operation to cause the transfer gate to isolate the bit line from the reference voltage generator, to cause the reference voltage generator to generate the reference voltage in response to the sampled and stored precharge voltage and to couple the bit line and the reference voltage to the sense amplifier, and operative during a third mode of operation to isolate the sense amplifier from the bit line and the reference voltage and to energize the sense amplifier to generate an output voltage derived from charge stored in the memory cell and the reference voltage.

2. The apparatus of claim 1 further comprising a supply voltage, wherein the reference voltage generator comprises a first capacitor and a second capacitor and wherein the reference voltage comprises the sampled and stored precharge voltage modified by a fraction of the supply voltage determined at least in part by the relative values of the first capacitor and the second capacitor.

3. The apparatus of claim 2 wherein the control circuit is operative to couple at least one of the first and second capacitors to the reference voltage generator after the bit line has been isolated from the reference voltage generator.

4. The apparatus of claim 1 wherein the sense amplifier comprises a differential sense amplifier.

5. The apparatus of claim 1 wherein the control circuit comprises:
    a precharge transistor arranged to precharge the bit line during the first mode of operation;
    a first switch transistor arranged to couple the sense amplifier to the bit line during the second mode of operation and to isolate the sense amplifier from the bit line during the third mode of operation;
    a second switch transistor arranged to couple reference voltage to the sense amplifier during the second mode of operation and to isolate the reference voltage from the sense amplifier during the third mode of operation; and
    a third switch transistor arranged to isolate the sense amplifier from the supply voltage during at least the second mode of operation and to couple the sense amplifier to the supply voltage during the third mode of operation.

6. The apparatus of claim 5 wherein the control circuit is arranged to couple the sense amplifier to the supply voltage through the third switch transistor after the sense amplifier has been isolated from the bit line and the reference voltage through the first and second switch transistors.

7. In a digital memory system including a memory cell arranged to store charge and a bit line, a method of providing an adaptive reference voltage to a sense amplifier comprising:
    precharging the bit line to generate a bit line precharge voltage;
    sampling and storing the bit line precharge voltage;
    isolating the bit line from the sampled and stored bit line precharge voltage;
    generating a reference voltage in response to the sampled and stored precharge voltage;
    coupling the bit line and the reference voltage to the sense amplifier so that the sense amplifier receives a voltage based on the charge stored in the memory cell;
    isolating the sense amplifier from the bit line and the reference voltage; and energizing the sense amplifier to generate an output voltage derived from the charge stored in the memory cell and the reference voltage.

8. The method of claim 7 further comprising a supply voltage, wherein said generating a reference voltage comprises modifying the sampled and stored precharge voltage to a fraction of the supply voltage by capacitance dividing.

9. The method of claim 7 wherein said generating a reference voltage occurs after said isolating the bit line.

10. The method of claim 7 wherein the sense amplifier comprises a differential sense amplifier.

11. The method of claim 10 wherein said isolating the sense amplifier occurs before said energizing the sense amplifier.

12. The method of claim 7 wherein the steps are performed in the order stated in claim 7.

\* \* \* \* \*